(12) United States Patent
Smail et al.

(10) Patent No.: US 9,893,924 B2
(45) Date of Patent: Feb. 13, 2018

(54) MODULE FOR A RADIO RECEIVER

(71) Applicant: NXP B.V., Eindhoven (NL)

(72) Inventors: Zahir Smail, Cairon (FR); Olivier Jamin, Caen (FR); Carol Herve, Caen (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/062,141

(22) Filed: Mar. 6, 2016

(65) Prior Publication Data

US 2016/0269208 A1 Sep. 15, 2016

(30) Foreign Application Priority Data

Mar. 11, 2015 (EP) .................................... 15290065

(51) Int. Cl.
| | | |
|---|---|---|
| *H04B 1/10* | (2006.01) | |
| *H04L 27/26* | (2006.01) | |
| *H04B 1/00* | (2006.01) | |
| *H03D 3/00* | (2006.01) | |
| *H04L 27/38* | (2006.01) | |

(52) U.S. Cl.
CPC ........... *H04L 27/265* (2013.01); *H03D 3/008* (2013.01); *H03D 3/009* (2013.01); *H04B 1/0017* (2013.01); *H04L 27/3863* (2013.01); *H04L 27/3872* (2013.01); *H04L 27/3881* (2013.01); *H03D 2200/005* (2013.01); *H03D 2200/006* (2013.01)

(58) Field of Classification Search
CPC ............. H04L 27/2332; H04L 27/2273; H04L 2027/0057; H04L 7/0334; H04L 12/2602; H04L 25/03038; H04L 27/2647; H04L 2025/03414; H04L 25/03057; H04B 1/1036

USPC .................................. 375/259–285, 316–352
See application file for complete search history.

(56) References Cited

U.S. PATENT DOCUMENTS

| | | | | |
|---|---|---|---|---|
| 3,739,351 | A * | 6/1973 | Forbes ..................... | H04L 7/007 375/370 |
| 3,742,461 | A * | 6/1973 | Forbes ..................... | H04L 7/042 327/141 |
| 5,617,060 | A * | 4/1997 | Wilson .................... | H03D 3/002 330/129 |
| 5,809,090 | A * | 9/1998 | Buternowsky ......... | H04B 7/084 340/7.21 |
| 6,317,589 | B1 * | 11/2001 | Nash ..................... | H03G 3/3068 375/345 |

(Continued)

OTHER PUBLICATIONS

Extended European Search Report for Patent Appln. No. 15290065.0 (dated Dec. 2, 2015).

(Continued)

*Primary Examiner* — James M Perez

(57) ABSTRACT

The disclosure relates to a module for a radio receiver. The module comprises an input terminal; an output terminal; a main signal path for communicating in-phase and quadrature signals between the input terminal and the output terminal; and a second signal path. The second signal path is connected in parallel with the main signal path and is configured to: extract in-phase and quadrature signals from the main signal path; filter the extracted in-phase and quadrature signals; detect an error in the filtered, extracted in-phase and quadrature signals; and apply a correction to in-phase and quadrature signals on the main signal path based on the error.

15 Claims, 11 Drawing Sheets

(56) References Cited

U.S. PATENT DOCUMENTS

| | | | |
|---|---|---|---|
| 6,744,825 B1* | 6/2004 | Rimstad | H03M 3/50 375/225 |
| 6,990,060 B2* | 1/2006 | Butash | G06F 17/141 370/210 |
| 7,130,359 B2* | 10/2006 | Rahman | H03D 3/008 375/316 |
| 7,209,526 B2* | 4/2007 | Kim | H03D 3/009 375/316 |
| 7,248,625 B2* | 7/2007 | Chien | H04B 1/30 375/219 |
| 7,251,298 B1* | 7/2007 | Hietala | H03D 3/008 375/340 |
| 7,421,040 B2* | 9/2008 | Cowley | H04B 1/005 348/729 |
| 7,769,105 B1* | 8/2010 | McIntire | G01S 7/006 342/57 |
| 7,962,949 B2* | 6/2011 | Busson | H04N 5/4446 348/731 |
| 7,983,648 B2* | 7/2011 | Qian | H03D 3/008 375/329 |
| 8,121,214 B2* | 2/2012 | Tal | H03B 21/02 370/206 |
| 8,135,086 B1* | 3/2012 | Sychaleun | H04L 5/06 375/260 |
| 8,249,129 B2* | 8/2012 | Fudge | H04B 1/7136 341/152 |
| 8,269,551 B2* | 9/2012 | Liao | H03H 11/22 327/553 |
| 8,326,252 B2* | 12/2012 | Li | H04B 1/0032 455/302 |
| 8,340,167 B2* | 12/2012 | Feng | H04B 17/21 375/226 |
| 8,363,695 B2* | 1/2013 | Mochizuki | H04B 1/713 375/136 |
| 8,379,766 B2* | 2/2013 | Lococo | H04B 1/1615 375/316 |
| 8,385,471 B2* | 2/2013 | Lococo | H04B 1/1615 375/316 |
| 8,401,116 B2* | 3/2013 | Jamin | H03H 11/04 375/316 |
| 8,416,899 B2* | 4/2013 | Laurent-Michel | H04B 1/001 375/350 |
| 8,503,545 B2* | 8/2013 | Li | H04L 27/3863 375/227 |
| 8,649,464 B2* | 2/2014 | Eitel | H04L 27/3863 375/316 |
| 8,798,216 B2* | 8/2014 | Pullela | H03D 7/165 375/318 |
| 8,995,589 B1* | 3/2015 | Qiu | H03L 7/099 375/316 |
| 9,031,171 B2* | 5/2015 | Smail | H04B 1/16 375/340 |
| 9,036,740 B2* | 5/2015 | Khoury | H03D 1/04 375/316 |
| 9,042,500 B1* | 5/2015 | Wong | H04B 1/1036 375/346 |
| 9,264,156 B2* | 2/2016 | Wilhelmsson | H04L 27/3863 |
| 9,325,553 B2* | 4/2016 | Kaukovuori | H04B 1/0057 |
| 9,571,137 B2* | 2/2017 | Robert | H04B 1/0475 |
| 9,621,206 B2* | 4/2017 | Jamin | H04B 1/1018 |
| 9,748,964 B1* | 8/2017 | Kabir | H03M 1/002 |
| 2001/0036152 A1* | 11/2001 | Butash | G06F 17/141 370/210 |
| 2003/0206603 A1* | 11/2003 | Husted | H04L 27/3863 375/324 |
| 2004/0037375 A1* | 2/2004 | Cowley | H04L 27/0008 375/344 |
| 2004/0146121 A1* | 7/2004 | Brown | H04B 1/30 375/322 |
| 2004/0183589 A1 | 9/2004 | Duncan et al. | |
| 2004/0229589 A1* | 11/2004 | Behzad | H03D 7/1441 455/285 |
| 2005/0110550 A1 | 5/2005 | Shi et al. | |
| 2005/0243219 A1* | 11/2005 | Yun | H03D 3/008 348/725 |
| 2006/0068739 A1* | 3/2006 | Maeda | H04B 1/30 455/295 |
| 2006/0083335 A1* | 4/2006 | Seendripu | H03D 3/008 375/332 |
| 2006/0222117 A1* | 10/2006 | Rahman | H03D 3/008 375/345 |
| 2006/0256216 A1* | 11/2006 | Takahiko | H03D 3/007 348/264 |
| 2006/0256895 A1* | 11/2006 | Cho | H04L 27/2332 375/332 |
| 2007/0030931 A1* | 2/2007 | Arambepola | H03G 3/345 375/346 |
| 2007/0047634 A1* | 3/2007 | Kang | H03D 3/008 375/226 |
| 2007/0047669 A1* | 3/2007 | Mak | H03D 3/007 375/316 |
| 2007/0071132 A1* | 3/2007 | May | H03D 3/007 375/322 |
| 2007/0104291 A1* | 5/2007 | Yoon | H04L 27/3827 375/324 |
| 2007/0123188 A1* | 5/2007 | Mo | H03D 3/009 455/302 |
| 2007/0211837 A1* | 9/2007 | Zipper | H04B 1/28 375/350 |
| 2007/0223608 A1* | 9/2007 | Nakayama | H04L 27/2601 375/260 |
| 2007/0298733 A1* | 12/2007 | Cole | H04B 17/101 455/114.2 |
| 2008/0055010 A1* | 3/2008 | Lerner | H03B 21/02 331/37 |
| 2009/0190698 A1* | 7/2009 | Schwarzmueller | H04B 15/02 375/344 |
| 2009/0310717 A1* | 12/2009 | Huang | H04L 27/2334 375/340 |
| 2010/0104045 A1* | 4/2010 | Santraine | H03D 3/009 375/324 |
| 2010/0159837 A1* | 6/2010 | Dent | H04B 1/525 455/63.1 |
| 2010/0159858 A1* | 6/2010 | Dent | H04B 1/123 455/131 |
| 2011/0110473 A1* | 5/2011 | Keehr | H04B 1/1018 375/350 |
| 2011/0134334 A1* | 6/2011 | Stevenson | H04B 15/04 348/731 |
| 2011/0134986 A1* | 6/2011 | Skull | H04L 27/01 375/229 |
| 2011/0142172 A1* | 6/2011 | Bode | H04B 1/30 375/316 |
| 2011/0150069 A1* | 6/2011 | Jamin | H03H 11/04 375/229 |
| 2011/0206162 A1* | 8/2011 | Lococo | H04B 1/1615 375/316 |
| 2011/0222633 A1* | 9/2011 | Pullela | H03D 7/165 375/318 |
| 2012/0230372 A1* | 9/2012 | Park | H04B 1/30 375/148 |
| 2013/0039444 A1* | 2/2013 | Porret | H04B 1/0007 375/316 |
| 2013/0322570 A1* | 12/2013 | Harada | H04B 17/345 375/340 |
| 2014/0029700 A1* | 1/2014 | Viswanathan | H03D 3/009 375/324 |
| 2014/0056386 A1* | 2/2014 | Jomatsu | H04L 27/3863 375/320 |
| 2014/0133606 A1* | 5/2014 | Mochizuki | H04W 52/0245 375/340 |
| 2014/0169410 A1* | 6/2014 | Tanaka | G01S 19/37 375/148 |
| 2014/0169504 A1* | 6/2014 | Smail | H04B 1/16 375/340 |
| 2014/0177761 A1* | 6/2014 | Patel | H04L 27/06 375/340 |

(56) References Cited

U.S. PATENT DOCUMENTS

| | | | |
|---|---|---|---|
| 2014/0198689 A1* | 7/2014 | Loh | H04L 27/2601 370/280 |
| 2014/0241466 A1* | 8/2014 | Cajegas, III | H04L 27/2271 375/326 |
| 2015/0117577 A1* | 4/2015 | Valadon | H04L 27/3863 375/350 |
| 2015/0172086 A1* | 6/2015 | Khoshgard | H04L 27/2646 375/260 |
| 2015/0200628 A1* | 7/2015 | Rutten | H04L 27/3863 455/326 |
| 2015/0236887 A1* | 8/2015 | Kaukovuori | H04L 27/2647 375/349 |
| 2016/0028424 A1* | 1/2016 | Jamin | H04B 1/1018 455/307 |

OTHER PUBLICATIONS

Nicolay, Thomas et al; "Baseband Signal Processing of Digital Video Broadcasting Direct-Conversion Zero-IF Tuners"; IEEE Transactions on Consumer Electronics, vol. 51, Issue 1; pp. 48-53 (2005).

Schuchert, Andreas et al; "Frequency Domain Equalization of IQ Imbalance in OFDM Receivers"; IEEE International Conference on Consumer Electronics; pp. 28-29 (2001).

* cited by examiner

MODULE FOR A RADIO RECEIVER

CROSS-REFERENCE TO RELATED APPLICATIONS

This application claims the priority under 35 U.S.C. § 119 of European patent application no. 15290065.0, filed Mar. 11, 2015 the contents of which are incorporated by reference herein.

This disclosure relates to a module for a radio receiver, and in particular, although not exclusively, to a digital front end module.

Modern radio receivers, such as those used for television applications, typically comprise both analogue and digital sections in order to efficiently process signals. A difficulty found in conventional radio receivers relates to providing the required channel selectivity and image rejection properties in an efficient manner.

According to a first aspect there is provided a module for a radio receiver, the module comprising:
an input terminal;
an output terminal;
a main signal path for communicating in-phase and quadrature signals between the input terminal and the output terminal; and
a second signal path connected in parallel with the main signal path and configured to:
extract in-phase and quadrature signals from the main signal path;
filter the extracted in-phase and quadrature signals;
detect an error in the filtered, extracted in-phase and quadrature signals; and
apply a correction to in-phase and quadrature signals on the main signal path based on the error.

The use of the correction path in parallel with the main signal path allows simpler filtering techniques to be applied prior to error detection and therefore simplifies implementation of the module. The simplification enabled by the use of the correction path can be afforded because filtering and error detection is applied to extracted signals rather than signals on the main path. The main path signals themselves may not be filtered by the correction path. The filtering techniques applied in the correction path may therefore not be constrained by the requirement of maintaining signal fidelity in a desired channel, as may be the case for signals on the main signal path. Simpler filtering may therefore be applied in the correction path than would be desirable for signals on the main signal path.

The in-phase and/or quadrature signals may comprise a desired channel. The second signal path may comprise a filter. The filter may be configured to filter the extracted in-phase and/or quadrature signals by passing a first portion of the desired channel. The filter may be configured to filter the extracted in-phase and/or quadrature signals by rejecting a second portion of the desired channel.

The filter may be a band pass filter. The band pass filter may be configured to perform band pass filtering on the extracted in-phase and/or quadrature signals prior to detecting an error in the extracting in-phase and/or quadrature signals. The band pass filter may be configured to pass only a sub-band of the desired frequency band. The band pass filter may be configured to pass a zero intermediate frequency, ZIF, signal or a near-zero intermediate frequency, NZIF, signal. The filtering performed by the second signal path may comprise band pass filtering extracted ZIF or NZIF in-phase and quadrature signals. The second signal path may comprise a second band pass filter provided in parallel with the first band pass filter. The second band pass filer may be configured to pass the other of the ZIF signal and the NZIF signal. The second signal path may further comprise a selector configured to enable either the first or second band pass filter for signal processing.

The module may comprise a channel selection unit at the output. The channel selection unit may be configured to select a channel and provide the channel for post processing.

The second signal path may be configured to extract the in-phase and/or quadrature signals at an extraction point of the main signal path. The second signal path may be configured to apply the correction to the in-phase and quadrature signals at a correction point of the main signal path. The extraction point may be downstream of the correction point in order to provide a feedback loop.

The error may comprise an amplitude mismatch. The module may comprise an amplitude mismatch detection unit configured to detect the amplitude mismatch. The module may comprise an amplitude mismatch correction unit configured to apply a correction to the in-phase and/or quadrature signals in the main signal path based on the detected amplitude mismatch. The error may comprise a phase mismatch. The module may comprise a phase mismatch detection unit configured to detect the amplitude mismatch. The module may comprise a phase mismatch correction unit configured to apply a correction to the in-phase and/or quadrature signals in the main signal path based on the phase mismatch. The error may comprise a direct current, DC, offset. The module may comprise a DC offset detection unit configured to detect the DC offset. The module may comprise a DC offset correction unit may be configured to apply a correction to the in-phase and/or quadrature signals in the main signal path based on the direct current offset.

According to a further aspect there is provided a radio receiver comprising:
a radio frequency front end for receiving a radio signal from an antenna and providing analogue in-phase and quadrature signals;
one or more analogue-to-digital converters for converting the analogue in-phase and quadrature signals into digital in-phase and quadrature signals; and
a digital front-end comprising the module of any preceding claim and configured to receive the digital in-phase and quadrature signals and provide a selected channel for post processing.

The filter may be configured to pass signals having a centre frequency that is an eighth of a sampling frequency of the one or more analogue-to-digital converters.

According to a further aspect there is provided a method of operating a module for a radio receiver, the method comprising:
receiving in-phase and quadrature signals comprising a desired channel at an input terminal of the module;
extracting in-phase and quadrature signals from a main signal path between the input terminal and an output terminal of the module;
filtering the extracted in-phase and quadrature signals in a second signal path that is parallel with the main signal path;
detecting an error in the filtered, extracted in-phase and quadrature signals in the second signal path; and
applying a correction to the in-phase and quadrature signals in the main signal path based on the error; and
providing the corrected in-phase and quadrature signals at the output of the module.

There may be provided a computer program, which when run on a computer, causes the computer to configure any apparatus, including a module, radio receiver, circuit, controller or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

BRIEF DESCRIPTION OF THE DRAWINGS

One or more embodiments will now be described, by way of example only, and with reference to the accompanying figures in which.

DETAILED DESCRIPTION

Figure 1:
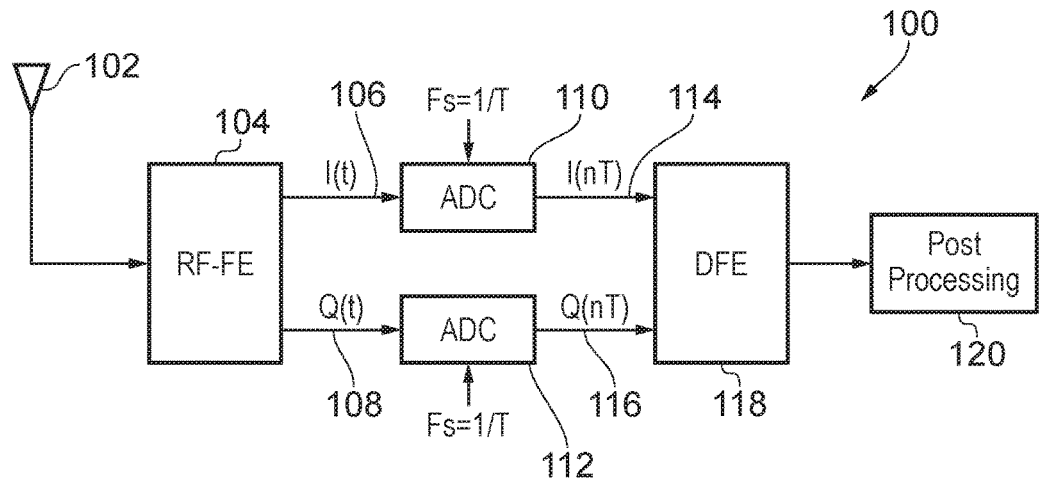
FIG. 1 illustrates a receiver chain.

FIG. 1 illustrates a radio receiver chain 100. The receiver chain 100 comprises an antenna 102 for providing a radio signal to a radio frequency (RF) front end module 104. The RF front end module 104 may comprise various amplifiers, mixers and filters. The RF front end module 104 is configured to convert the radio signal into an analogue in-phase signal 106 and an analogue quadrature signal 108. The RF front end module 104 may convert the radio signal into zero intermediate frequency (ZIF) signals or near-zero intermediate frequency (NZIF) signals after amplification and filtering, for example.

The in-phase and quadrature analogue signals 106, 108 are provided to respective analogue-to-digital converters 110, 112 which digitize the analogue signals based on a sampling frequency Fs and provide a digital in-phase signal 114 and a digital quadrature signal 116 to a digital front end module 118.

The digital front end module (DFE) 118 performs various tasks. Two typical tasks for the DFE 118 are providing channel selection and image rejection. Channel selection can be achieved using multirate and multistage cascaded filters, implemented in a polyphase way and based on a cascaded integrator comb (CIC) decimator, for example. In order to reduce circuit complexity in NZIF examples, baseband conversion may be provided prior to channel selection. Image rejection by the DFE 118 is discussed further below with reference to FIGS. 2a and 2b. An example digital front end for providing channel selection and static image rejection for a zero intermediate frequency signal is discussed below with reference to FIG. 3.

Returning to FIG. 1, a post-processor 120 performs post processing on the selected, image-rejected channel data. The post-processor 120 is application dependent and may perform, for example, channel demodulation, channel stacking or other software defined radio features. Both the digital front end 118 and the post-processor 120 may be implemented using only hardware, only software or a combination of hardware and software.

Figure 2A:
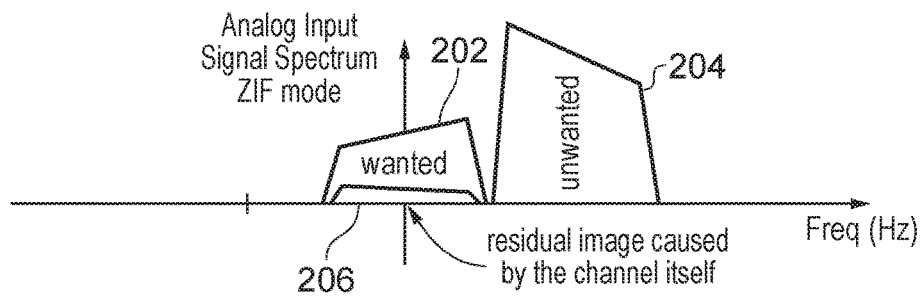
FIG. 2a illustrates a frequency spectrum for a zero intermediate frequency (ZIF) signal comprising a wanted channel and an unwanted channel.

FIG. 2a illustrates an amplitude against frequency spectrum for a ZIF signal comprising a wanted channel 202 in a first frequency band and an unwanted channel 204 in a second frequency band. The unwanted channel 204 is in a neighbouring frequency band to the wanted channel 202 and does not cause significant interference with the wanted channel 202. A residual image 206 of the wanted channel 202 is also present in the same frequency band as the wanted channel 202. The image 206 relates to artefacts introduced by RF blocks such as mixers and analogue filters within the radio frequency front end.

Figure 2B:
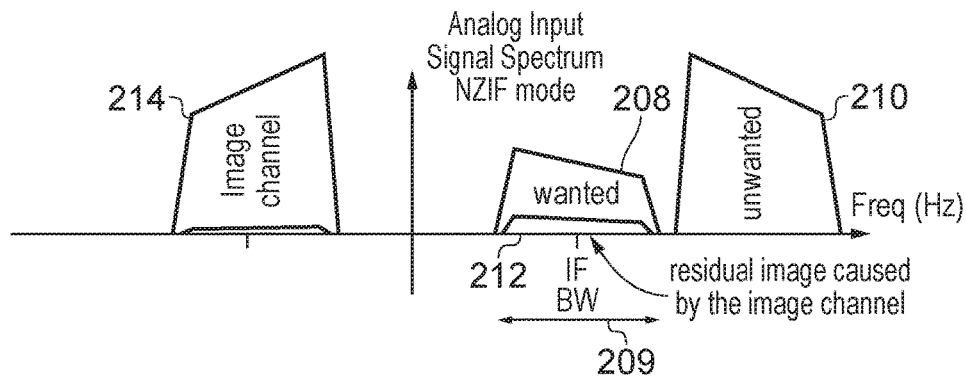
FIG. 2b illustrates a frequency spectrum for a near-zero intermediate frequency (NZIF) signal comprising a wanted channel and an unwanted channel.

FIG. 2b illustrates an amplitude against frequency spectrum for a NZIF signal comprising a wanted channel 208 (in a first frequency band having a bandwidth 209) and an unwanted channel 210 in a second frequency band. As in FIG. 2a, the unwanted channel 210 is in a neighbouring frequency band to the wanted channel and does not cause significant interference with the wanted channel 208. In this example, an image 214 of the wanted channel 208 is present in a third frequency band, which is a negative frequency band that corresponds to the positive frequency band of the wanted channel 208. A residual image 212 caused by the image channel 214 interferes with the wanted channel 208 because it falls in the same frequency band as the wanted channel 208.

Figure 3:
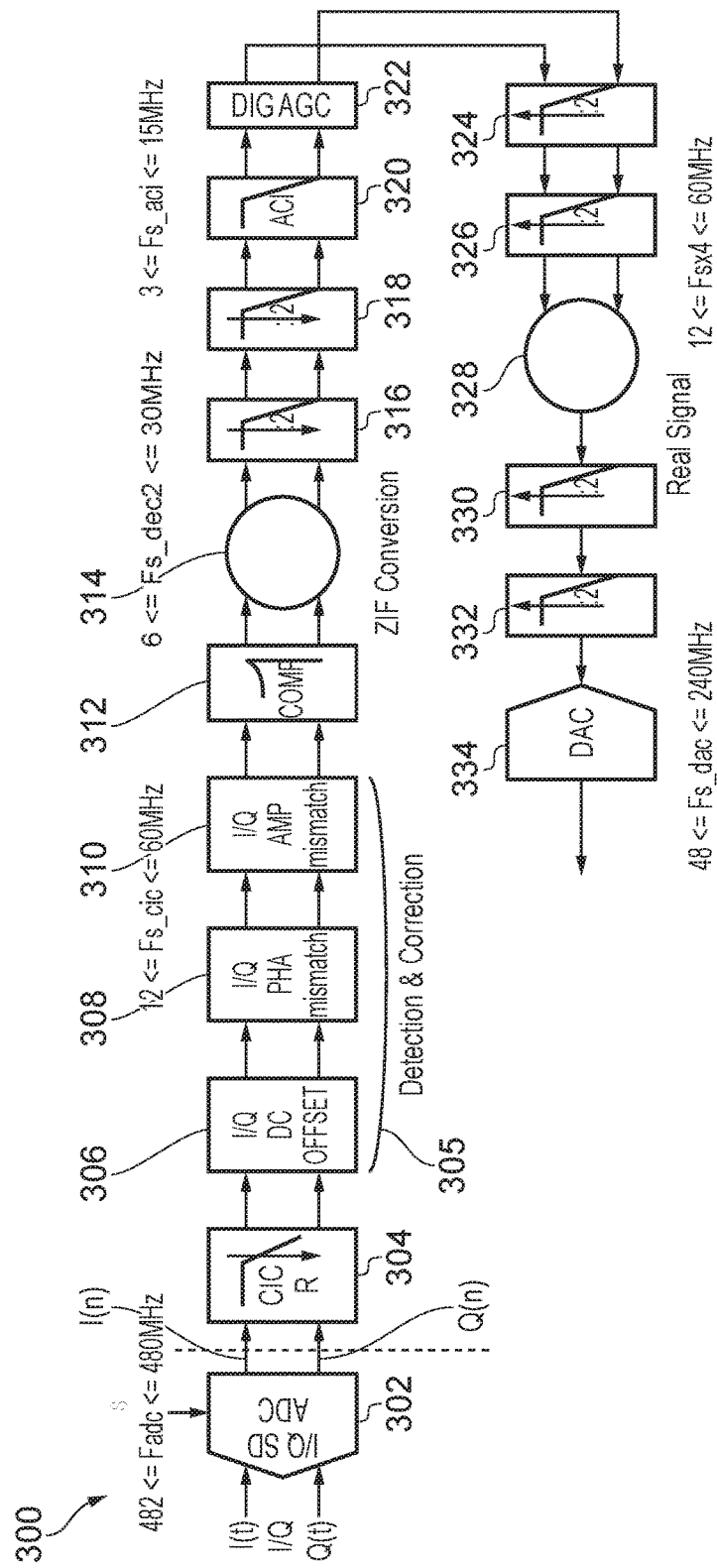
FIG. 3 illustrates a digital front end for a receiver chain.

FIG. 3 illustrates an example of a digital front end 300 for providing channel selection and static image rejection for ZIF and NZIF signals. The digital front end 300 is suitable for addressing the tasks of image rejection and channel selection in applications that exhibit a static I/Q imbalance (that is, where the I/Q imbalance is frequency independent). A typical application of the digital front end 300 is a digital television tuner.

The digital front end 300 receives digital in-phase and quadrature signals I(n), Q(n) from an analogue-to-digital converter 302 that provides the functionality of the analogue-to-digital converters discussed with reference to FIG. 1.

The digital front end 300 comprises a number of subunits which provide the functionality of channel selection and image rejection. These subunits are provided in a linear chain, discussed in sequence below. Each subunit acts on both the in-phase and quadrature signals.

An integrated comb filter 304 down filters the in-phase and quadrature signals I(n), Q(n) by a factor R. A group 305 of units 306, 308, 310 provide detection and correction of the signals. The group 305 in this example comprises an I/Q DC offset unit 306, an I/Q phase mismatch unit 308 and an I/Q amplitude mismatch unit 310 in that order in series. The I/Q DC offset block 306 provides an estimate of, and compensation for, any DC offset in the signals. The I/Q phase mismatch unit 308 provide an estimate of, and compensation for, a phase mismatch in the signals. The I/Q amplitude mismatch unit 310 provides an estimate of, and compensation for, an amplitude mismatch in the signals.

The signals output by the group 305 of units are filtered by a low pass filter 312 and are processed by a derotator 314 in order to achieve base band conversion by applying a frequency translation exp(−j*2*pi*IFin*n*T) to the signal (where j^2=−1, n is a sample with a period T and IFin is an input intermediate frequency). The converted baseband signal is passed through a plurality of dowsampling filters 316, 318 and a channel selection filter 320 before undergoing digital automatic gain control (AGC) by an AGC unit 322. The signal output by the AGC unit 322 is then passed through a plurality of upscaling filters 324, 326. A ZIF signal from the upsampling filters 324, 326 is then translated back to an intermediate frequency by a rotator 328 by applying a frequency translation exp(j*IFout*n*T). Only a real part of the signal output by the derotator 328 is further processed. The real signal is passed through yet a further plurality of upscaling filters 330, 332. Finally, the signal output by the upscaling filters 330, 332 is converted to an analogue signal by digital-to-analogue converter 334. The digital-to-analogue converter 334 may be provided outside of the digital front end as part of a post processing step.

The ability of the digital front end 300 to compensate for mismatch in the desired channel is influenced by the interfering signals outside the band of interest of the desired channel. This can result in digital front end 300 applying poor compensation in systems in which the I/Q imbalance is frequency dependent. The performance of the digital front end 300 is discussed below with reference to FIGS. 4a to 4d.

Figure 4A:
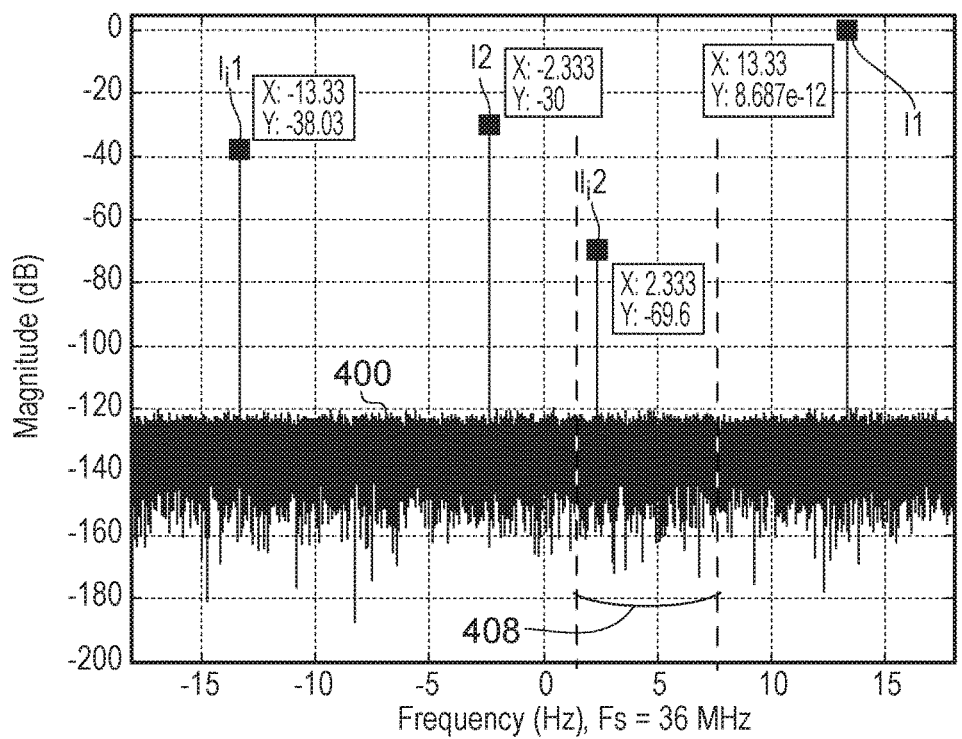
FIGS. 4a to 4d illustrate profiles of simulated characteristics of the digital front end of FIG. 3.
Figure 4B:
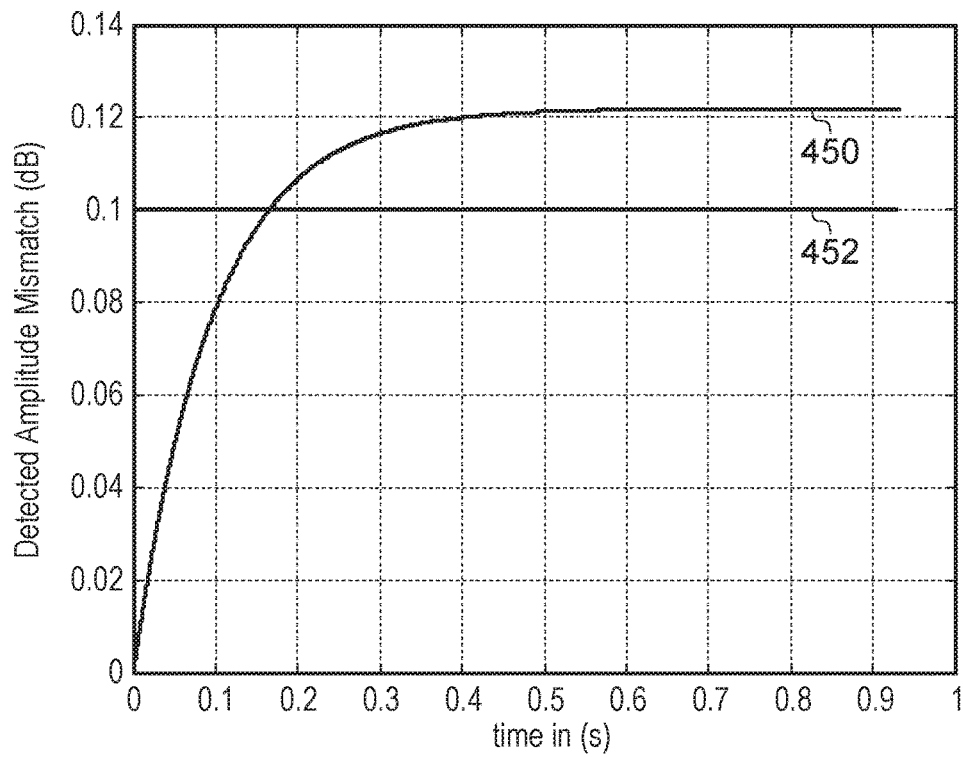
Figure 4C:
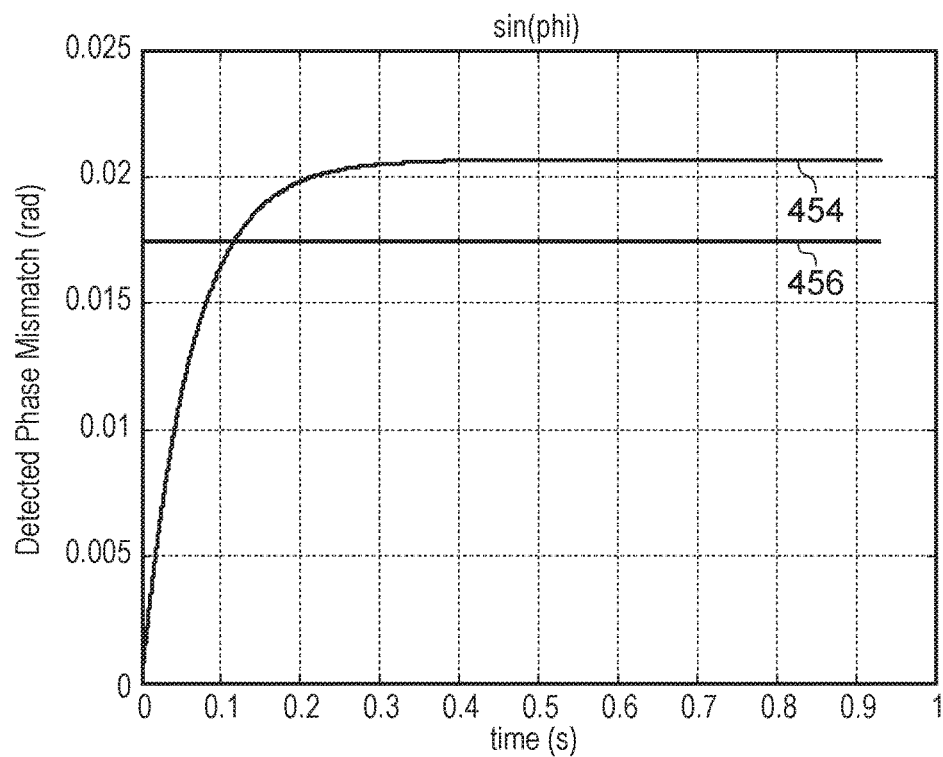
Figure 4D:
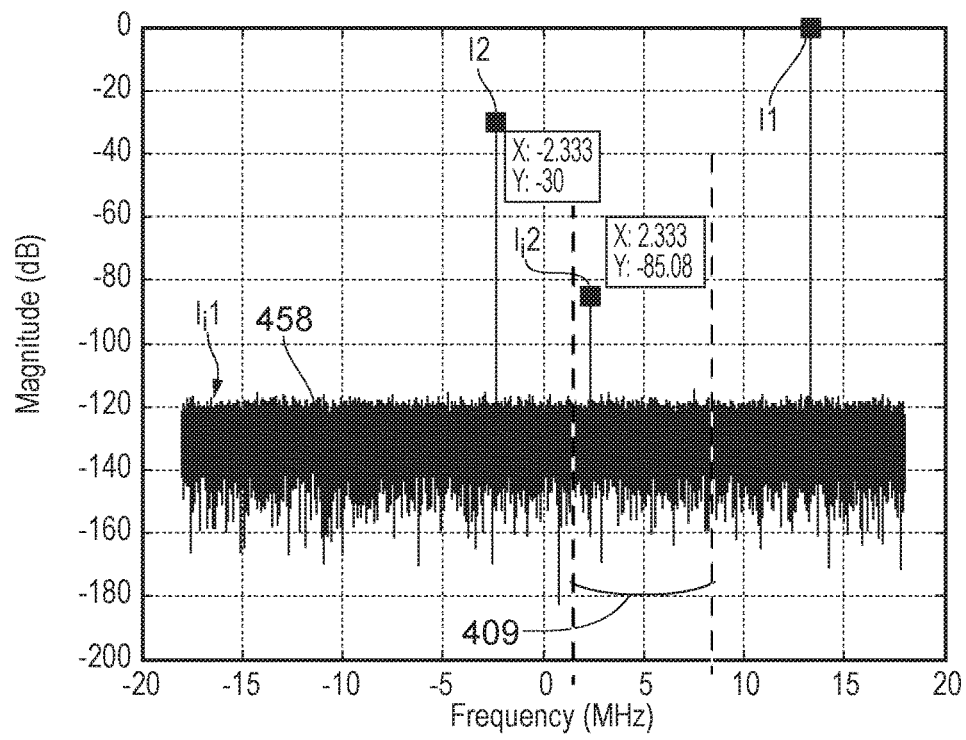

FIG. 4a illustrates a frequency distribution of an input signal for the digital front end. FIGS. 4b to 4d illustrate simulation results of the digital front end of FIG. 3 when input signal illustrated in FIG. 4a is applied.

In FIG. 4a, a test signal 400 having a desired, or wanted, channel, in a first frequency band 408 is shown. The desired channel 408 has a bandwidth of 6 MHz, and is between 1.5 MHz and 7.5 MHz. The test signal 400 comprises two complex tones that are simulations of interfering signals. A first interfering tone I1 is present with a magnitude of 0 dB at 13.33 MHz. A second interfering tone I2 is present with a magnitude of −30 dB at −2.33 MHz. A first image tone I1 of the first interfering tone I1 is present with a magnitude of −38.03 dB at −13.33 MHz and so falls outside of the wanted channel 408. A second image tone I2 of the second interfering tone I2 is present with a magnitude of −69.6 dB at 2.333 MHz and so falls within the wanted channel 408.

In order to simulate the frequency dependent I/Q imbalance phenomenon, an amplitude mismatch of 0.1 dB and a phase mismatch of 1 degree (0.1745 rd) is applied to the second interfering tone I2 and an amplitude mismatch of 0.12 dB and a phase mismatch of 1.1 degree (0.192 rd), is applied to the first interfering tone I1. That is, the first interfering tone I1 at 13.33 MHz has a 10% higher mismatch than the second interfering tone I2 at −2.333 MHz.

FIG. 4b illustrates a plot of detected amplitude mismatch 450, in decibels, against time, in seconds, after start up of the digital front end of FIG. 3. A target level 452 of 0.1 dB for amplitude mismatch is also shown in FIG. 4b. FIG. 4b shows how the detected amplitude mismatch 450 initially rises over a period of about 0.45 seconds, and then settles at about 0.12 dB. That is, the detected amplitude mismatch 450 does not satisfy the target level 452. There is a trade-off between convergence time and precision (final value) that may be selected by altering component values depending on the intended application.

FIG. 4c illustrates a plot of a detected phase mismatch 454, in radians, against time, in seconds, after start up of the digital front end of FIG. 3. A target level 456 of 0.0175 rad for detected phase mismatch is also shown in FIG. 3. The detected phase mismatch 454 initially rises over a period of 0.45 seconds, and then settles at about 0.021 rad. As with amplitude mismatch, there is a trade-off between improved convergence time and precision that may be selected by altering component values depending on the intended application.

FIG. 4d illustrates a plot of the magnitude of an output signal 458 from the digital front end of FIG. 3, in decibels, against frequency, in megahertz. As in FIG. 4a, the desired channel 409 is present at 1.5 MHz and 7.5 MHz. In comparison to the input signal 400 shown in FIG. 4a, the first interfering tone I1 is still present with a magnitude of 0 dB at 13.33 MHz but that the image I_i1 of the first interfering tone at −13.33 MHz has been attenuated to a noise background level of the power density of the output signal 458 at about −120 dB. The second interfering tone I2 is still present with a magnitude of −30 dB at −2.33 MHz. The image tone I2 of the second interfering signal is also present at 2.333 MHz (within the wanted channel) with an attenuated magnitude of −85.08 dB, compared to the magnitude of −69.6 dB illustrated in the input signal of FIG. 4a.

This digital front end of FIG. 3 can perform adequately in applications where the I/Q mismatch is static, or in which the effect of frequency dependence is negligible. However, these conditions do not apply in the case of many applications, such as in RF CMOS tuners. In applications in which an anti-aliasing filter is used, the mismatch may be significant, or even dominant, in the bandwidth of interest. FIGS. 4a to 4d shows that such frequency components are not sufficiently filtered by the digital front end in FIG. 3 before providing detection and correction. A result of this inadequate filtering is that such a digital front end may provide an inaccurate detection of mismatches and offsets, and so the subsequent correction of mismatches and offsets may be imprecise.

A number of strategies may be used in order to manage the I/Q imbalance in systems in which the I/Q imbalance is frequency dependent.

A method in which management is performed in the analogue domain involves performing in-phase/quadrature (I/Q) calibration using a single tone reference signal at system start-up or when the desired channel changes frequency. A problem encountered with such a method is that the requirement for generating a tone and performing calibration increases settling time during use and results in greater circuit complexity.

Another method for management of I/Q imbalance for use in systems such as DVB-T involve generating reference pilots in the frequency domain in order to estimate/compensate for the I/Q imbalance. However, such methods require a frequency domain transformation and are dependent on the specific type of system in which it is implemented.

Figure 5:
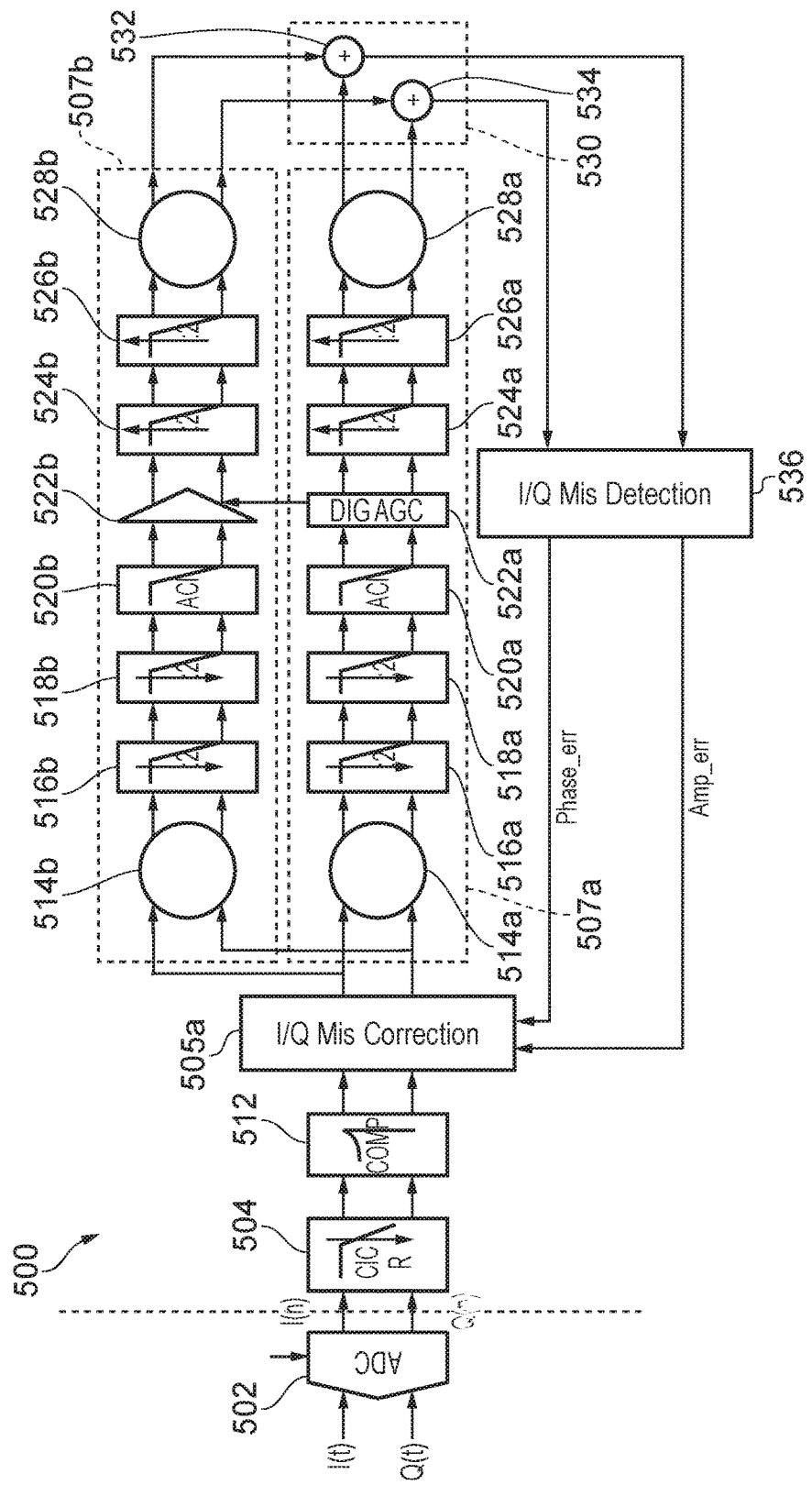
FIG. 5 illustrates another digital front end for a receiver chain.

FIG. 5 illustrates another example of a digital front end 500 for managing the I/Q imbalance in systems in which the desired channel is not static. In the digital front end 500, part of the processing path has been duplicated in order to enable mismatch detection for the in-phase and quadrature signals.

Many of the units used to implement the digital front end 500 are similar to corresponding units described with reference to FIG. 3. In general, corresponding series of reference numerals will be used to discuss corresponding components between FIGS. 3 and 5. The functionality of such components will not be discussed further here.

The digital front end 500 receives digital in-phase and quadrature signals I(n), Q(n) from an analogue-to-digital converter 502. The signals are down filtered by a factor R by an integrated comb filter 504 and a further low pass filter 512, which in this example acts on the signal before an in-phase and quadrature mismatch correction block 505a.

Each of the in-phone and quadrature signals from the mismatch correction block 550 follow two paths including a channel path 507a and an image path 507b.

The channel path 507a selects a wanted channel by band pass filtering unwanted frequencies around a channel signal frequency band. In the channel path 507a, the signals from the mismatch correction block 505a undergo zero intermediate frequency (ZIF) conversion by a channel path derotator 514a by applying a frequency translation $\exp(-j*2*\pi*IFin*n*T)$ to the channel path signal (where j is the square root of minus one, n is a sample with a period T and IFin is an input intermediate frequency). The converted signals are passed through a plurality of channel path decimator filters 516a, 518a and a channel path selection filter 520a before undergoing digital automatic gain control (AGC) by a channel path AGC unit 522a. The gain controlled signals are passed through a further plurality of channel path interpolator filters 524a, 526a before being translated back to output intermediate frequency IFout signals by a channel path rotator 528a which applies an $\exp(j*2*\pi*Fout*n*T)$ translation (where ZIF is a zero intermediate frequency signal on the channel path).

The image path 507b selects an image signal by band pass filtering unwanted frequencies around an image signal frequency band. The image signal frequency band is outside of the channel signal frequency band. In the image path 507b, the signals from the mismatch correction block 505a undergo zero intermediate frequency (ZIF) conversion by an image path rotator 514b by applying a frequency translation $\exp(j*2*\pi*IFin*n*T)$ to the channel path signal. The translated signals are passed through a plurality of image path decimator filters 516b, 518b and an image path channel selection filter 520b before undergoing amplification by an image path amplifier 522b. A gain of the image path amplifier 522b is controlled in response to a gain applied to the channel path 507a by the channel path AGC unit 522a. The gain controlled signals are passed through a further plurality of image path interpolator filters 524b, 526b before being translated back to output intermediate frequency IFout signals by image path derotator 528b which applies an $\exp(-j*ZIF*nT)$ translation (where ZIF is a zero intermediate frequency signal on the channel path).

The respective in-phase and quadrature signals output by the channel and image paths 507a, 507b are merged in a merging unit 530 in order to combine the channel path signals with the corresponding outputs of the image path 507b. The merging unit 530 comprises an in-phase summing unit 532 for the in-phase signals and a quadrature summing unit 534 for the quadrature signals.

In-phase and quadrature signals that are output by the merging unit 530 are provided to an I/Q mismatch detection unit 536. The I/Q mismatch detection unit 536 subsequently processes the combined channel and image path signals. The I/Q mismatch detection unit 536 determines whether there are any mismatch errors between the in-phase and quadrature signals. The I/Q mismatch detection unit 536 then provides error signals back to the in-phase and quadrature mismatch correction block 505a so that it can process signals it receives in order to reduce the error represented by the error signals. Errors in the in-phase and quadrature signals include amplitude mismatch, phase mismatch and direct current offset. In this way, the digital front end 500 compensates for I/Q mismatch errors in a corrected channel signal that includes the main signal path signal.

However, in order to provide such compensation the digital front end 500 requires a duplicate path (the image path 507b) and so increases the chip area required by the system which consequently increases the cost of the digital front end 500. The provision of a duplicate path also increases power consumption when the digital front end 500 is in use.

The further examples described below are directed to a different approach for addressing image rejection issues such as those encountered in radio frequency (RF) receivers systems. These examples may be implemented using recursive algorithms that are valid for zero intermediate frequency (ZIF) or near zero intermediate frequency (NZIF) modes. Such algorithms may be suitable for hybrid receivers (Analog/Digital) and can be implemented in systems that use a variety of standards, such as DVB-T, DVB-C, ATSC. As such, the examples can be considered to be independent of a standard that is used.

Figure 6:
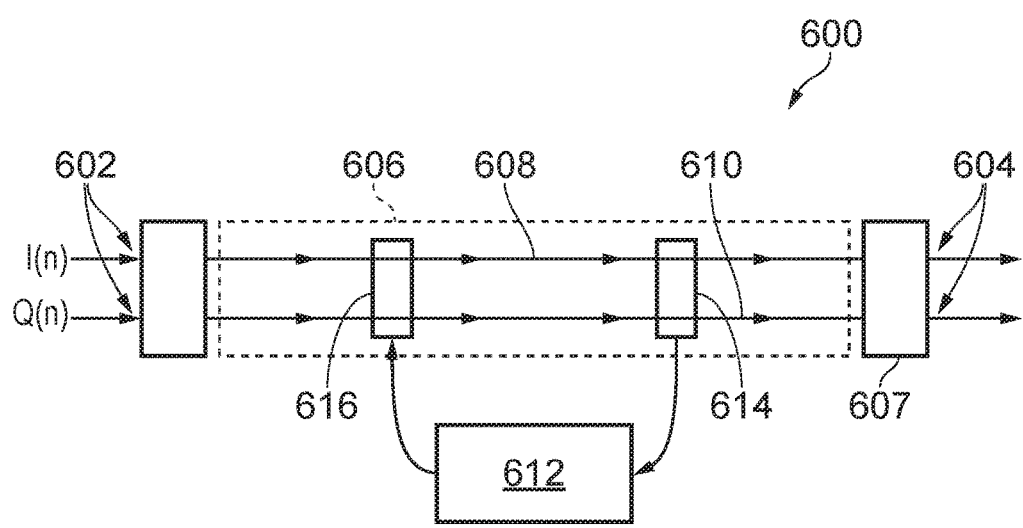
FIG. 6 illustrates an improved digital front end for a receiver chain.

FIG. 6 illustrates a module 600 for a radio receiver which may provide the image rejection functionality of the digital front end described with reference to FIG. 1. The module comprises an input terminal 602 and an output terminal 604. Time domain digital in-phase and quadrature signals I(n), Q(n) are received at the input terminal 604. The in-phase and quadrature signals comprise a desired channel having a certain bandwidth. Signals from the input terminal 602 are provided to the main signal path 606. The main signal path 606 in this example has an in-phase path 608 and a quadrature path 610 for conveying the respective in-phase and quadrature signals. The in-phase and quadrature signals 608, 610 in the main signal path 606 may be referred to as main path signals. The main signal path 606 conveys the signals to the output terminal 604.

In this example, a channel selection unit 607 is provided at the output terminal 604 of the main signal path 606. The channel selection unit 607 provides signal processing related to selection of the desired channel. The channel selection unit 607 of the main signal path may be configured to perform channel selection using filtering and/or Fourier transformation of the received in-phase and quadrature signals. For example, the channel selection unit 607 may comprise one or more of the components of the channel path described with reference to FIG. 5.

A second signal path is connected in parallel with the main signal path 606. The second signal path may also be referred to as a detection path 612 (estimation path) or correction path. The detection path 612 is configured to extract, from the main signal path 606, in-phase and quadrature signals at a signal extraction point 614 of the main signal path 606.

The extracted signals are digital time domain signals. Extracted in-phase and quadrature signals may be referred to as extracted signals.

The detection path 612 is configured to filter and perform signal processing on the extracted signals in order to detect mismatch errors in the extracted signals. Filtering the extracted signals may comprise applying a filter in which a portion of the desired channel is allowed to pass and another portion of a desired channel is rejected. That is, a subset of the desired channel frequency band may be filtered out in the correction path 612 before further processing. The filter may be configured to reject interference generated by, for example, analogue filters in an RF front end. The filtering may comprise, for example, band pass filtering. The error detected by the detection path 612 may relate to an amplitude mismatch, a phase mismatch or a direct current offset in the extracted signals, for example.

The detection path 612 is configured to apply a correction to in-phase and quadrature signals on the main signal path 606 at a correction point 616 of the main signal path 606 based on the error detected in the extracted signals. The detection path 612 of the module 600 may be used in the processing of ZIF or NZIF signals to compensate for a frequency dependent I/Q imbalance. A passband filter may be used in a NZIF mode or a low pass may be used in a ZIF mode. Different sets of processing loop gains may be put in place to speed up a convergence time of the module 600, depending on the intended application. An example implementation of a correction path is discussed below with regard to the FIG. 7.

Returning to FIG. 6, in effect the detection path 612 performs signal processing in parallel with, and in isolation from, the main signal path 606. The extracted signals are isolated from the in-phase and quadrature signals on the main signal path 606 in that processes applied to the extracted signals do not affect the in-phase and quadrature signals on the main signal path 606. The extracted signals may also be considered to be independent of the in-phase and quadrature signals on the main signal path 606 for similar reasons.

The signal extraction point 614 is downstream of the correction point 616 on the main signal path 606 in order to provide a feedback loop. The correction applied at the correction point 616 may comprise modifying a gain of a filter in the main signal path 606 at the correction point 616 based on the processed extracted signals. The error may comprise one or more of an amplitude mismatch, a phase mismatch and a direct current offset. Depending on the type of error detected by the correction path 612, the correction path 612 may apply a correction to the main path signals at the correction point 616 based on the amplitude mismatch, phase mismatch or DC offset detected in the extracted signals.

The detection path 612 therefore enables an error in extracted signals to be determined separately from the main signal path 606 and a correction to be applied to the main path signals based upon the detected error. The correction path 612 may be configured to filter out frequency dependent mismatch created by the analogue filters (such as those in the radio-frequency front-end illustrated in FIG. 1) around filter cut-off prior to I/Q imbalance detection. Such filtering techniques are destructive in that they distort signals and/or remove part of a frequency band of interest. It is therefore not appropriate to perform such filtering on the main signal path. An advantage of this approach is that potentially destructive filtering techniques can be applied to the extracted signals in order to determine the error in the signal in a more accurate, or more efficient manner. The required corrections are then applied to the main path signals.

The module 600 addresses a number of the issues encountered in the I/Q imbalance compensation schemes described with reference to FIGS. 3 and 5. By performing I/Q imbalance detection in the digital domain, rather than the analogue domain, the limitations of the analogue method described with reference to FIG. 3 can be alleviated or overcome. For example, the system of FIG. 3 provides a maximum of 62 dB image rejection, which can be insufficient for many television applications. In addition, detection in the digital domain does not require the generation of complex analogue signals for calibration purposes unlike some implementations of the example of FIG. 3. The power consumption and silicon area required to implement the module 600 of FIG. 6 may be reduced because the duplication of the signal paths required in the example of FIG. 5 is reduced or eliminated. For the same reason, the complexity of the circuit of FIG. 6 is also reduced compared to that of FIG. 5.

Figure 7:
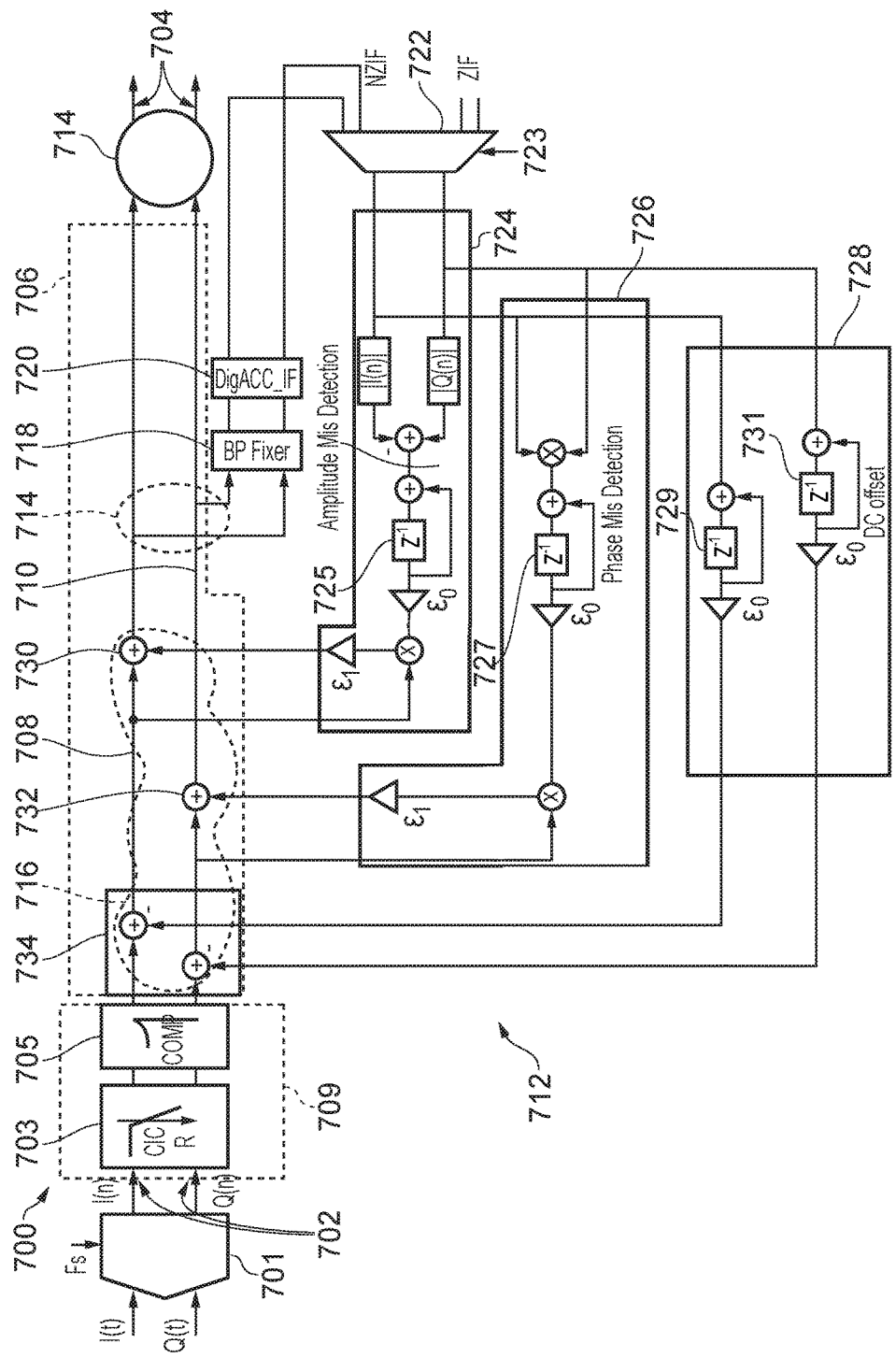
FIG. 7 illustrates another improved digital front end for a receiver chain.

FIG. 7 shows another improved digital front end 700 for a receiver chain together with an analogue-to-digital converter 701. The digital front end 700 is similar in many respects to the digital front end described with reference to FIG. 6. Corresponding series of reference numerals are used between FIGS. 6 and 7 to describe similar features.

The analogue-to-digital converter 701 is configured to digitize analogue in-phase and quadrature signals I(t), Q(t) based on a sampling frequency Fs and provides a digital in-phase signal I(n) and a digital quadrature signal to the module 700.

The module 700 is similar to the module described with reference to FIG. 6 in that it is implemented in the digital domain and comprises an input terminal 702, an output terminal 704 and a main signal path 706 between the input terminal 702 and the output terminal 704. A detection path 712 is configured to extract, from the main signal path 706, in-phase and quadrature signals at a signal extraction point 714 of the main signal path 706. The signal extraction point 714 may be a simple connection to a point in the main signal path 706 that communicates a signal from the input terminal 702 to the output terminal 704, in order to tap-off extracted signals. The detection path 712 compensates for the detected errors (for example, it applies a correction) at the correction point 716, which is provided upstream of the signal extraction point 714 in terms of signal propagation along the main signal path 706 in order to provide a feedback loop.

The module 700 of FIG. 7 differs from the module described with reference to FIG. 6 in that it provides a specific example of an implementation of the detection path 712. In addition, an input filtering unit 709 is provided at the input terminal 702. The input filtering unit 709 comprises an integrated comb filter 703 and a further low pass filter 705, which are similar to components described previously in regard to FIGS. 3 and 5. At the output terminal 704 there is a derotator 714 for providing a baseband conversion. Additional blocks for providing the functionality of the channel selection unit of the digital front end can also be provided at the output terminal 704 of the main signal path.

The correction path 712 has five sections including an NZIF filtering section 718, 720, a ZIF filtering section (not shown), a mode selector 722, error detection units 724, 726, 728 and error correction units 730, 732, 734, the arrangement and operation of which are described below. The error correction units 730, 732, 734 are provided at a correction point 716 on the main signal path 706.

The NZIF filtering section and the ZIF filtering section are each coupled between the extraction point 714 and respective NZIF and ZIF inputs of the mode selector 722. The components of the NZIF filtering section and the ZIF filtering section are configured to perform filtering of extracted in-phase and quadrature signals in order to remove artefacts, such as those caused by analogue filters in an RF front end.

The NZIF filtering section comprises a NZIF band pass filter 718 and a NZIF digital variable gain amplifier 720. The NZIF band pass filter 718 may be configured to pass a frequency band, or a portion of a band, associated with an NZIF channel. The ZIF filtering section (not shown) is similar to the NZIF filter and comprises a ZIF band pass filter and a ZIF digital variable gain amplifier. The ZIF band pass filter may be configured to pass a frequency band, or a portion of a band, associated with a ZIF channel. The digital variable gain amplifiers are each configured to increase the amplitude of the filtered I/Q components.

The band pass filters in the NZIF and ZIF filtering sections are configured to capture sufficient energy from the wanted channel in the extracted signals for efficient estimation of I/Q mismatch while removing adjacent interferers in order to avoid frequency dependent effects caused by analogue filters, such as those commonly used in radio frequency front ends. The module 700 reduces the effect of the frequency dependent mismatch created by the analogue filters around their cut-off frequencies by filtering out these components prior to I/Q imbalance detection. The band pass filters do not necessarily provide channel selection in a strict sense, which can be provided at the output on main signal path by a channel selection unit, for example.

The band pass filters in the NZIF and ZIF filtering sections may be relatively simple because the extracted signals are separate from the main signal path and so any artefacts introduced into the extracted signals by the band pass filters do not affect the output signals provided by the module 700. For example, the desired channel may be provided in a desired frequency band and the band pass filters may, as a side effect, substantially distort the extracted signals within the desired frequency band without deleteriously affecting operation of the main signal path 706 of the module 700. The NZIF digital variable gain amplifier 720 may therefore be optimised for determining an I/Q imbalance without being constrained to maintain channel signal fidelity.

The mode selector 722 is configured to enable the NZIF or ZIF band pass filter for signal processing by outputting the signals from either the ZIF filtering section or the NZIF filtering section in response to a selection signal received at a selection input terminal 723. The selection signal can be set by a controller in accordance with a mode of operation of the receiver.

The error detection units 724, 726, 728 include an amplitude mismatch detection unit 724, a phase mismatch detection unit 726 and a DC offset detection unit 728. The error correction units 730, 732, 734 include an amplitude mismatch correction unit 730, a phase mismatch correction unit 732 and a DC offset correction unit 734. The error detection units 724, 726, 728 have a first gain setting (Epsilon-0) and a second gain setting (Epsilon-1).

The first and second gain settings can be used to adjust the characteristics of the correction units in order to provide a desired mismatch precision for a given settling time.

The amplitude mismatch detection unit 724 is configured to detect, or estimate, an amplitude mismatch error between the in-phase and quadrature signals. This amplitude mismatch detection unit 724 may apply a recursive algorithm. In this example, the amplitude mismatch detection unit 724 is configured to:
- take a modulus of the filtered, extracted in-phase and quadrature signals;
- determine a difference between the modulus of the signals;
- apply, using first delay block 725, a one symbol period delay to a sum of the determined difference and feedback from an output of the first delay block 725;
- multiply the output of the first delay block 725 by the first gain setting (Epsilon-0) to provide a first amplitude mismatch factor signal;
- extract an in-phase signal from the main signal path 706 at an amplitude mismatch extraction point;
- multiply the extracted in-phase signal by the first amplitude mismatch factor signal to provide a second amplitude mismatch factor signal; and
- multiply the second amplitude mismatch factor signal by the second gain setting (Epsilon-1) to provide an amplitude mismatch correction signal.

The amplitude mismatch correction unit 730 is configured to subtract the amplitude mismatch correction signal, which relates to the mismatch error, from the in-phase signal 708 in the main signal path 706 at an amplitude mismatch correction point. The amplitude mismatch correction point is downstream of the amplitude mismatch extraction point in terms of signal propagation along the main signal path 706. In an alternative example, the amplitude mismatch correction unit 730 may operate on the quadrature signal. That is, the amplitude mismatch correction signal may be subtracted from the quadrature signal 710 in the main signal path 706.

The phase mismatch detection unit 726 is configured to detect a phase mismatch between the in-phase and quadrature signals and achieve a correlation between the inphase and quadrature signals. In an ideal case, the inphase and quadrature signals are orthogonal and so yield zero error. In this example, the phase mismatch detection unit 726 is configured to:
- multiply the in-phase signal by the quadrature signal to determine a product;
- apply a one symbol period delay, using a second delay block 727, to a sum of the determined product and feedback from an output of the second delay block 727;
- multiply the output of the second delay block 727 by the first gain setting (Epsilon-0) to provide a first phase mismatch factor signal;
- extract a quadrature signal from the main signal path 706 at a phase mismatch extraction point;
- multiply the extracted quadrature signal by the first phase mismatch factor signal to provide a second phase mismatch factor signal; and
- multiply the second phase mismatch factor signal by the second gain setting (Epsilon-1) to provide a phase mismatch correction signal.

The phase mismatch correction unit 732 is configured to subtract the phase mismatch correction signal, which relates to the estimated phase mismatch, from the quadrature signal 710 in the main signal path 706 at a phase mismatch correction point. The phase mismatch correction point is downstream of the phase mismatch extraction point in terms of signal propagation along the main signal path 706. In an alternative example, the phase mismatch correction unit 732 may operate on the in-phase signal. That is, the phase mismatch correction signal may be subtracted from the in-phase signal 708 in the main signal path 706.

The direct current (DC) offset mismatch detection unit 728 is configured to detect a DC offset between the in-phase and quadrature signals. The DC offset detection unit 726 may be configured to estimate DC offset level using a recursive feedback loop algorithm. In this example, the offset mismatch detection unit 728 is configured to:
a) apply a one symbol period delay, using a third delay block 729, to a sum of the extracted in-phase signal and feedback from an output of the third delay block 729; and
- multiply the output of the third delay block 729 by the first gain setting (Epsilon-0, which controls the speed and precision of the detection) to provide an in-phase DC offset correction signal, and b) apply a one symbol period delay, using a fourth delay block 731, to a sum of the extracted quadrature signal and feedback from an output of the fourth delay block 731; and
  multiply the output of the fourth delay block 731 by the first gain setting (Epsilon-0) to provide a quadrature DC offset correction signal.

The steps a) and b) above may be performed simultaneously.

In the DC offset correction unit 734, the in-phase DC offset correction signal is deducted from the in-phase signal 708 in the main signal path 706 and the quadrature DC offset correction signal is deducted from the quadrature signal 710 in the main signal path 706.

As discussed in regard to the module of FIG. 6, the design of the module 700 of FIG. 7 is efficient in that it permits the chip area and power consumption of the module 700 to be reduced compared to the previous examples. An implementation of the module 700 has been found to reduce the required chip area by 70% (0.18 mm$^2$ instead of 0.59 mm$^2$ in CMOS) compared to the example discussed with reference to FIG. 5 in which a duplicate signal path is provided for the image signal. The implementation of the module 700 of FIG. 7 also reduced power by 43% (29 mW instead of 51 mW) compared to the example of FIG. 5.

This improved performance of the module 700 of FIG. 7 (and the module described with reference to FIG. 6) may be enabled, at least in part, by isolating the mismatch detector units 724, 726, 728 from the main data path 706 which means that a band pass filter 718 with reduced operating requirements, and therefore reduced complexity may be used. The band pass filter 718 may be provided by either an infinite impulse response (IIR) filter or a finite impulse response (FIR) filter, for example. On the one hand, IIR filter are less complex than FIR filters in term of number of coefficients. Non-constant group delays associated with at least some IIR filters would have limited or no impact on the performance of the module 700 because the filter works on the extracted signals rather than main path signals. On the other hand, an advantage of FIR filters is that in some applications they may be more stable and less sensitive to limit cycles, which occur when the output of digital filter does not decay to zero when the input goes to zero and are due to data quantization after the feedback multiplier in the recursive loop. There may therefore be applications in which selection of either IIR or FIR filters is advantageous.

FIGS. 8a to 8d illustrate plots of simulated characteristics of the digital front end of FIG. 7 and correspond to the simulated characteristics illustrated in FIGS. 4a to 4d in relation to the digital front end of FIG. 3.

Figure 8A:
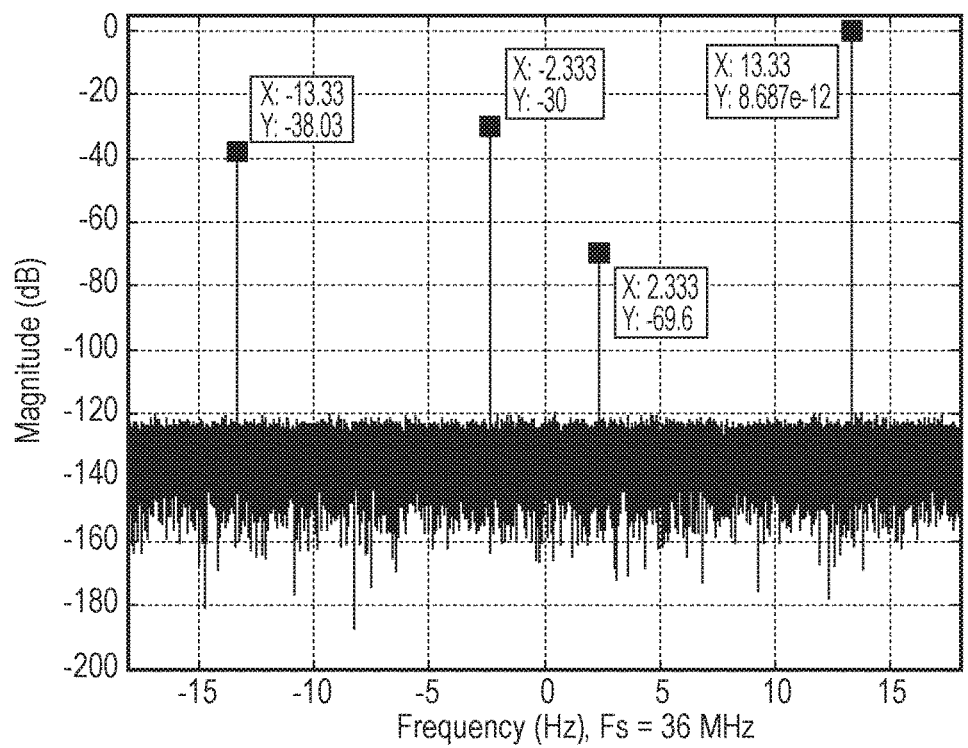
FIGS. 8a to 8d illustrate profiles of simulated characteristics of the digital front end of FIG. 7.

FIG. 8a illustrates a plot of the same test signals described with reference to FIG. 4a.

Figure 8B:
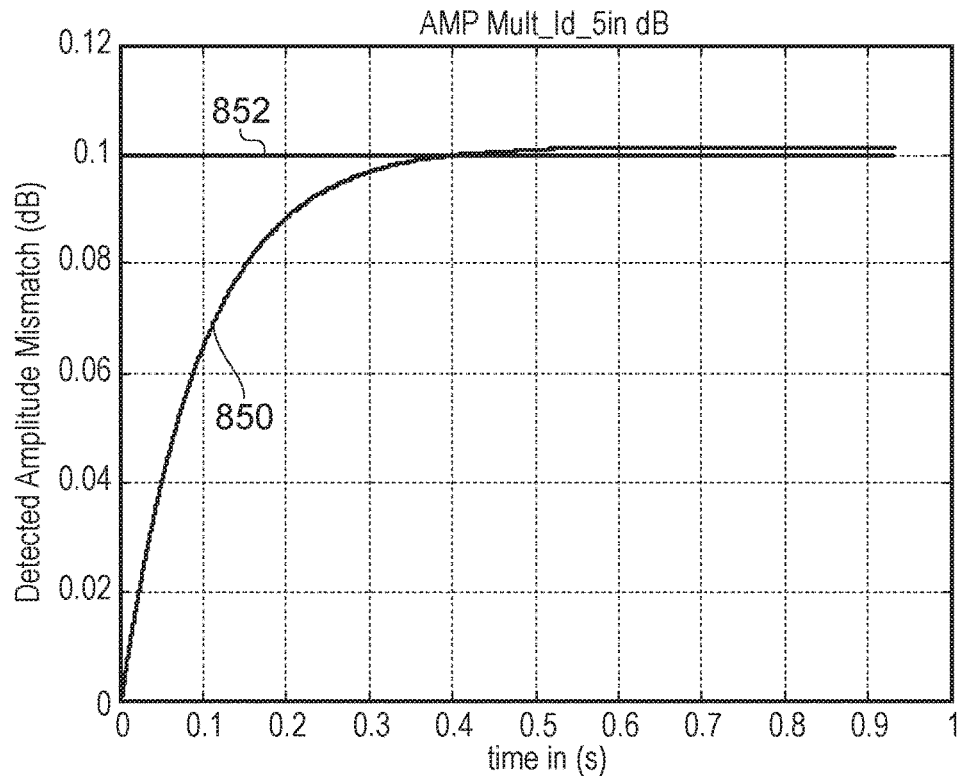

FIG. 8b illustrates a plot of a detected amplitude mismatch 850, in decibels, against time, in seconds, after starting up the digital front end. An amplitude mismatch target level 852 of 0.1 dB is shown in FIG. 8b, which is the same level as that presented in FIG. 4b. In FIG. 8b, the detected amplitude mismatch 850 initially rises over a period of about 0.45 seconds, and then settles at a value that is only marginally higher than the target level 852. The amplitude mismatch performance demonstrated in FIG. 8b is therefore improved compared to the example in FIG. 4b in which the detected amplitude mismatch settled at 0.12 dB for a similar convergence time.

Figure 8C:
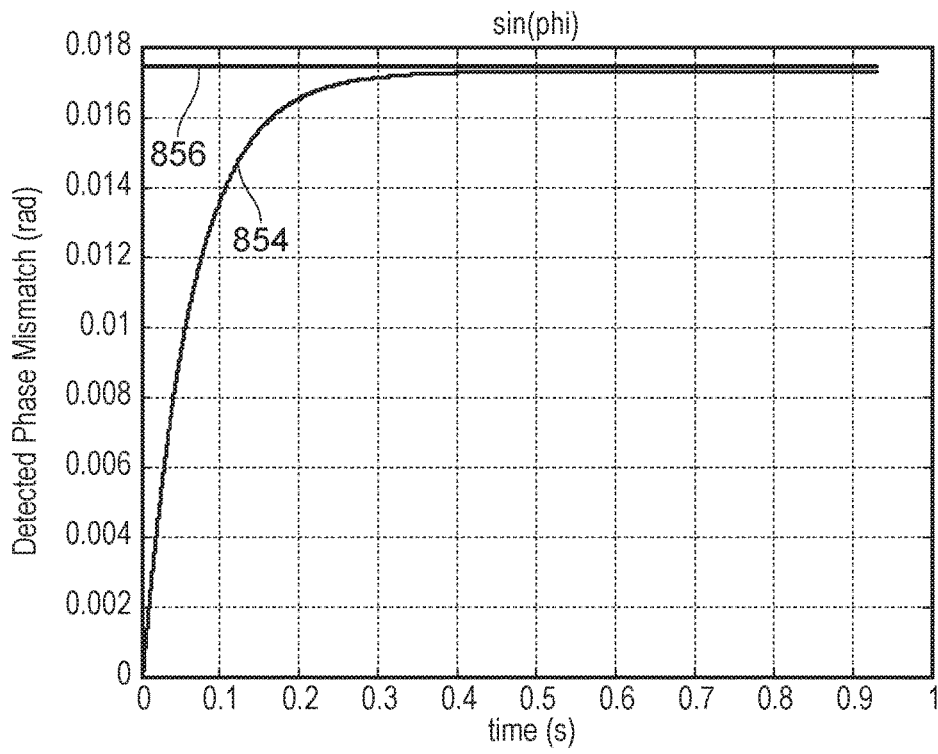

FIG. 8c illustrates a plot of a detected phase mismatch 854, in radians, against time, in seconds, after starting up the digital front end. A mismatch target level 856 of 0.0175 is shown in FIG. 8c, which is the same level as that presented in FIG. 4c. In FIG. 8c, the detected phase mismatch 850 initially rises over a period of about 0.45 seconds, and then settles at just under the target level 856. Phase mismatch performance demonstrated in FIG. 8c is therefore also improved compared to the example in FIG. 4c in which the detected phase mismatch settled at 0.021 rad for a similar convergence time.

Figure 8D:
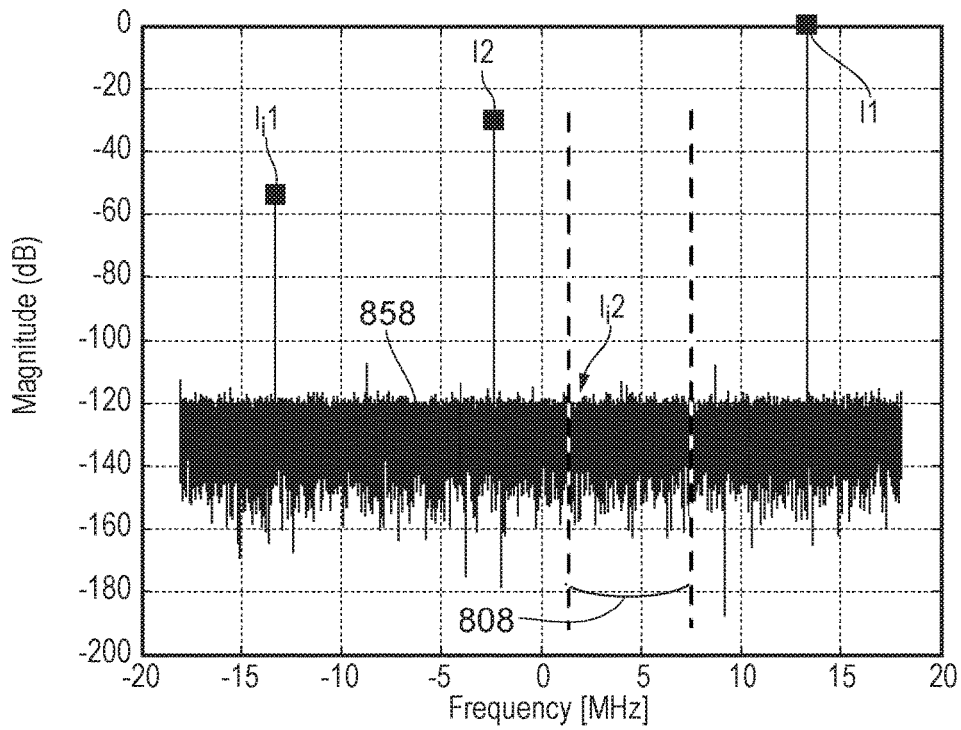

FIG. 8d illustrates a plot of a magnitude of an output signal 858 from the digital front end of FIG. 7, in decibels, against frequency, in megahertz. As in FIGS. 4a and 4d, the desired channel 808 is present at 1.5 MHz and 7.5 MHz. The first interfering tone I1 is present in FIG. 8d with a magnitude of 0 dB at 13.33 MHz. The second interfering tone I2 is present in FIG. 8d with a magnitude of −30 dB at −2.33 MHz.

In FIG. 8d, the image tone I2 of the second interfering signal at 2.333 MHz (within the wanted channel) is attenuated to the background level of about −120 dB compared to a magnitude of −69.6 dB in the input signal of FIG. 4a or −85.08 dB in the attenuated example of FIG. 4d. The improved rejection of the image by the module of FIG. 7 results in improved amplitude and phase mismatch performance demonstrated because the interfering signal within the channel has been removed.

In FIG. 8d, the image tone $I_i1$ of the first interfering signal at −13.33 MHz has been attenuated by a lesser degree than in the example of FIG. 4d, to about −55 dB. However, the image tone $I_i1$ of the first interfering signal does not fall within the wanted channel 808 and so the attenuation of this signal in the output signal 858 is of less importance than the image tone $I_i2$ of the second interfering signal, which is within the wanted channel 808.

Returning to FIG. 7, the module 700 may be used to compensate for phase mismatch in a desired channel with an intermediate frequency (IF) having a central frequency that is an eighth of a sampling frequency (Fs) of the analogue-to-digital converter 701. That is, IF=Fs/8. This functionality may be provided by the band pass filter 718 being configured to pass extracted signals having a centre frequency of an eighth of a sampling frequency of the analogue-to-digital converter 701. It has been found that the selection of this relationship between the intermediate frequency and the sampling frequency can be used to further simplify the band pass filter 718.

Figure 9:
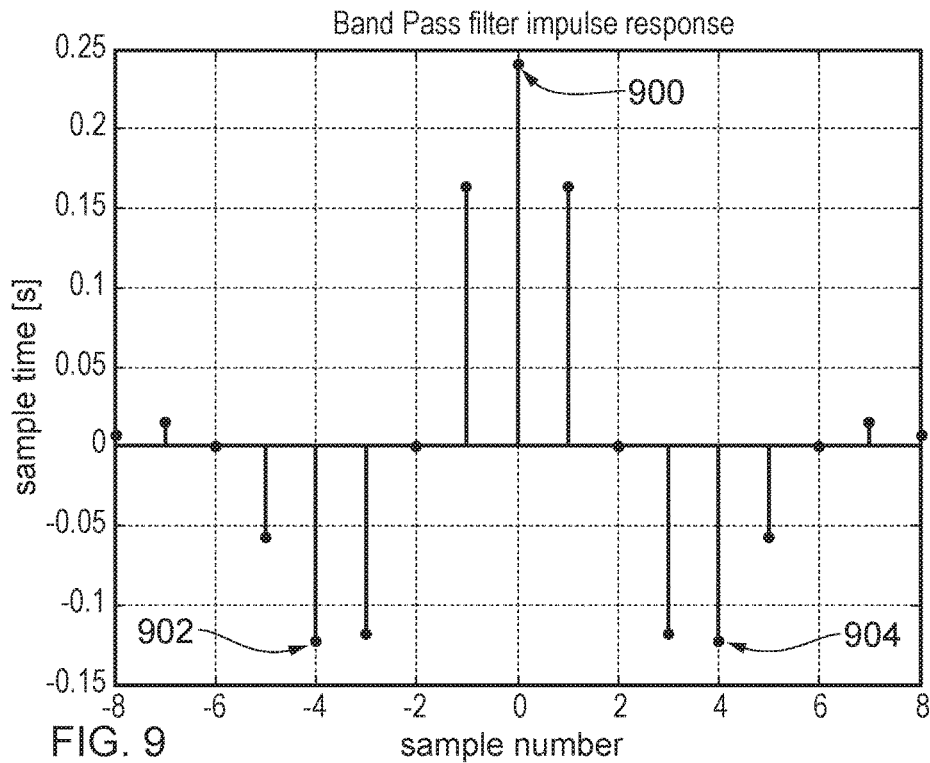
FIG. 9 illustrates a plot of a simulated impulse response of a finite impulse response (FIR) filter for the improved digital front end of FIG. 7.
Figure 10:
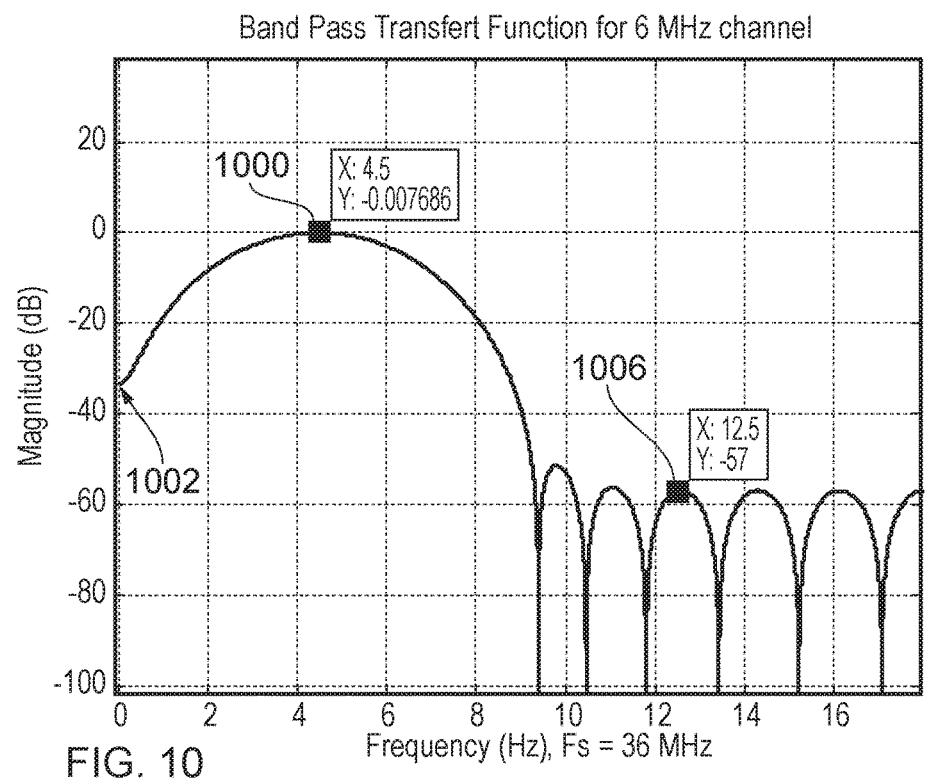
FIG. 10 illustrates a plot of a simulated transfer function for the FIR filter of FIG. 9.

FIGS. 9 and 10 illustrate characteristics of a simple FIR filter for use with a module, such as that described with regard to FIG. 6 or 7, in which an intermediate frequency NZIF signal is provided at an eighth of the sampling frequency.

FIG. 9 illustrates a generated impulse response for the FIR filter with 17 coefficients. The impulse response has a maximum value of about 0.25 at 0 and minima of about −0.12 at −4 and 4. The filter therefore provides a symmetric impulse response about 0.

One of the four coefficients is cancelled out due to the selection of the relationship between the intermediate frequency and sampling frequency and so the complexity of the filter is reduced by almost 25%.

FIG. 10 illustrates a simulated transfer function for the FIR filter described with regard to FIG. 9 in terms of magnitude, in decibels, against frequency, in megahertz. The frequency response of the filter is centred at an eighth of the sampling frequency. In this example, the sampling frequency is 36 MHz and the centre frequency 1000 is found at 4.5 MHz with a magnitude of approximately 0 dB.

The bandwidth is 6 MHz in this example. The DC component 1002 is attenuated by more than 30 dB. A frequency component 1006 at 12.5 MHz are typical of those found around a cut-off frequency of an analogue filter of a radio frequency front end. The frequency component 1006 is attenuated by 57 dB by the FIR filter.

The filter and module may be provided in an advanced television standards committee (ATSC) tuner.

Figure 11:
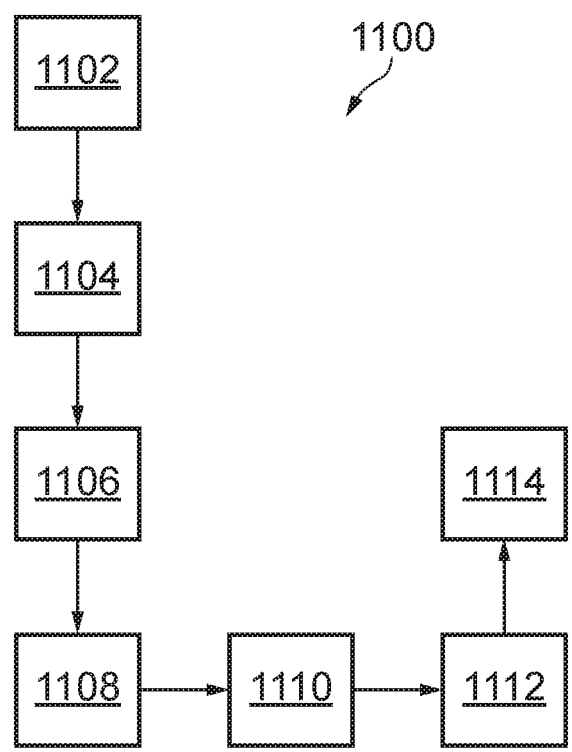
FIG. 11 illustrates a method of operating a module for a radio receiver.

FIG. 11 illustrates a method 1100 of operating a module for a radio receiver. The method 1100 comprises:
- providing 1102 a main signal path for conveying in-phase and quadrature signals between an input terminal and an output terminal of the module;
- receiving 1104 in-phase and quadrature signals comprising a desired channel at the input terminal;
- extracting 1106 in-phase and quadrature signals from the main signal path;
- filtering 1108 the extracted in-phase and quadrature signals in a second signal path that is parallel with the main signal path;
- detecting 1110 an error in the filtered, extracted in-phase and quadrature signals in the second signal path;
- applying 1112 a correction to the in-phase and quadrature signals in the main signal path based on the error; and
- providing 1114 the corrected in-phase and quadrature signals at the output of the module.

The method may be implemented using only hardware, only software or a combination of hardware and software. In general, the method may perform any of the steps described with reference to the module of FIG. 6 or FIG. 7.

The invention claimed is:

1. A module for a radio receiver, the module comprising:
an input terminal;
an output terminal;
a main signal path for communicating in-phase and quadrature signals between the input terminal and the output terminal; and
a second signal path connected in parallel with the main signal path and configured to:
extract in-phase and quadrature signals from the main signal path;
filter the extracted in-phase and quadrature signals;
detect an error in the filtered, extracted in-phase and quadrature signals; and
apply a correction to in-phase and quadrature signals on the main signal path based on the error;
wherein the in-phase and quadrature signals comprise a desired channel,
wherein the second signal path comprises a filter configured to filter the extracted in-phase and quadrature signals by:
passing a first portion of the desired channel; and
rejecting a second portion of the desired channel;
wherein the filter is a band pass filter that is configured to perform band pass filtering on the extracted in-phase and quadrature signals prior to detecting the error in the extracting in-phase and quadrature signals;
wherein the second signal path comprises a second band pass filter provided in parallel with the first band pass filter;
wherein the second band pass filter is configured to pass the other of the ZIF signal and the NZIF signal; and
wherein the second signal path further comprises a selector configured to enable either the first or second band pass filter for signal processing.

2. The module of claim 1,
wherein the band pass filter is configured to pass only a sub-band of the desired frequency band.

3. The module of claim 1,
wherein the band pass filter is configured to pass a zero intermediate frequency, ZIF, signal or a near-zero intermediate frequency, NZIF, signal,
wherein the filtering performed by the second signal path comprises band pass filtering extracted ZIF or NZIF in-phase and quadrature signals.

4. The module of claim 1, comprising a channel selection unit at the output, wherein the channel selection unit is configured to select a channel and provide the channel for post processing.

5. The module of claim 1, wherein the second signal path is configured to:
extract the in-phase and quadrature signals at an extraction point of the main signal path; and
apply the correction to the in-phase and quadrature signals at a correction point of the main signal path, wherein the extraction point is downstream of the correction point in order to provide a feedback loop.

6. The module of claim 1,
wherein the error comprises an amplitude mismatch, the module comprising:
an amplitude mismatch detection unit configured to detect the amplitude mismatch; and
an amplitude mismatch correction unit configured to apply a correction to the in-phase or quadrature signals in the main signal path based on the detected amplitude mismatch.

7. The module of claim 1,
wherein the error comprises a phase mismatch, the module comprising:
a phase mismatch detection unit configured to detect the amplitude mismatch; and
a phase mismatch correction unit configured to apply a correction to the in-phase and/or quadrature signals in the main signal path based on the phase mismatch.

8. The module of claim 1,
wherein the error comprises a direct current, DC, offset, the module comprising:
a DC offset detection unit configured to detect the DC offset; and
a DC offset correction unit configured to apply a correction to the in-phase and/or quadrature signals in the main signal path based on the direct current offset.

9. The module of claim 1:
wherein the second signal path is configured to filter both the extracted in-phase and quadrature signals after extracting the in-phase and quadrature signals from the main signal path.

10. The module of claim 1, wherein the second signal path is configured to:
extract the in-phase and quadrature signals from the main signal path before filtering the extracted in-phase with a band-pass filter, and filtering the extracted quadrature signals with the band-pass filter.

11. A radio receiver comprising:
a radio frequency front end for receiving a radio signal from an antenna and providing analogue in-phase and quadrature signals;
one or more analogue-to-digital converters for converting the analogue in-phase and quadrature signals into digital in-phase and quadrature signals; and a digital front-end comprising the module of claim 1 and configured to receive the digital in-phase and quadrature signals and provide a selected channel for post processing.

12. The radio receiver of claim 11,
wherein the filter is configured to pass signals having a centre frequency that is an eighth of a sampling frequency of the one or more analogue-to-digital converters;
wherein the in-phase and quadrature signals comprise a desired channel,
wherein the second signal path comprises a filter configured to filter the extracted in-phase and quadrature signals by:
passing a first portion of the desired channel; and
rejecting a second portion of the desired channel.

13. A method of operating a module for a radio receiver, the method comprising:
receiving in-phase and quadrature signals comprising a desired channel at an input terminal of the module;
extracting in-phase and quadrature signals from a main signal path between the input terminal and an output terminal of the module;
filtering the extracted in-phase and quadrature signals in a second signal path that is parallel with the main signal path;
detecting an error in the filtered, extracted in-phase and quadrature signals in the second signal path; and
applying a correction to the in-phase and quadrature signals in the main signal path based on the error; and
providing the corrected in-phase and quadrature signals at the output of the module
wherein the in-phase and quadrature signals comprise a desired channel,
wherein the second signal path comprises a filter configured to filter the extracted in-phase and quadrature signals by:
passing a first portion of the desired channel; and
rejecting a second portion of the desired channel;
wherein the filter is a band pass filter that is configured to perform band pass filtering on the extracted in-phase and quadrature signals prior to detecting the error in the extracting in-phase and quadrature signals;
wherein the second signal path comprises a second band pass filter provided in parallel with the first band pass filter;
wherein the second band pass filter is configured to pass the other of the ZIF signal and the NZIF signal; and
wherein the second signal path further comprises a selector configured to enable either the first or second band pass filter for signal processing.

14. An article of manufacture including at least one non-transitory, tangible machine readable storage medium containing executable machine instructions for operating a module for a radio receiver, executed by the module during operations of the radio receiver,
wherein the instructions include the method of claim 13.

15. A radio receiver comprising:
a radio frequency front end for receiving a radio signal from an antenna and providing analogue in-phase and quadrature signals;
one or more analogue-to-digital converters for converting the analogue in-phase and quadrature signals into digital in-phase and quadrature signals; and
a digital front-end comprising a module configured to receive the digital in-phase and quadrature signals and provide a selected channel for post processing, the module comprising:
an input terminal;
an output terminal;
a main signal path for communicating in-phase and quadrature signals between the input terminal and the output terminal; and
a second signal path connected in parallel with the main signal path and configured to:
extract in-phase and quadrature signals from the main signal path;
filter the extracted in-phase and quadrature signals;
detect an error in the filtered, extracted in-phase and quadrature signals; and
apply a correction to in-phase and quadrature signals on the main signal path based on the error; and
wherein the filter is configured to pass signals having a center frequency that is an eighth of a sampling frequency of the one or more analogue-to-digital converters;
wherein the in-phase and quadrature signals comprise a desired channel; and
wherein the filter is further configured to filter the extracted in-phase and quadrature signals by,
passing a first portion of the desired channel; and
rejecting a second portion of the desired channel.

* * * * *